(12) United States Patent
Houston et al.

(10) Patent No.: US 6,737,347 B1
(45) Date of Patent: May 18, 2004

(54) SEMICONDUCTOR DEVICE WITH FULLY SELF-ALIGNED LOCAL INTERCONNECTS, AND METHOD FOR FABRICATING THE DEVICE

(75) Inventors: Theodore W. Houston, Richardson, TX (US); Keith A. Joyner, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 10 days.

(21) Appl. No.: 09/661,735

(22) Filed: Sep. 14, 2000

Related U.S. Application Data
(60) Provisional application No. 60/160,495, filed on Oct. 20, 1999.

(51) Int. Cl.[7] ............... H01L 21/4763; H01L 21/44; H01L 21/302
(52) U.S. Cl. ............... 438/633; 438/637; 438/682; 438/717
(58) Field of Search ............... 438/585, 592, 438/631, 637, 655, 682, 633, 671, 717, 725; 257/382, 383, 384, 412, 413; 430/5, 24

(56) References Cited

U.S. PATENT DOCUMENTS

| | | | |
|---|---|---|---|
| 5,656,546 A | * | 8/1997 | Chen et al. ............... 438/586 |
| 5,753,557 A | * | 5/1998 | Tseng ............... 438/303 |
| 6,174,803 B1 | * | 1/2001 | Harvey ............... 438/638 |
| 6,248,622 B1 | * | 6/2001 | Lee ............... 438/239 |
| 6,337,272 B1 | * | 1/2002 | Hamanaka ............... 257/43 |

* cited by examiner

*Primary Examiner*—Hung Vu
(74) *Attorney, Agent, or Firm*—Yingsheng Tung; Wade James Brady, III; Frederick J. Telecky, Jr.

(57) ABSTRACT

A semiconductor device and a method for making it involve the semiconductor device (10, 110, 210, 310) having a substrate (11, 311) with spaced source and drain regions (13–14, 316–318, 321–323). A gate section (21) projects upwardly from between an adjacent pair of these regions, into an insulating layer (46, 363). In order to create local interconnects to the source and drain regions through the insulating layer, a patterned etch is carried out using an etch region (51), which extends over one of the gate sections from a location above one of the regions to a location above another of the regions. Etching in this etch region produces recesses (56–57) on opposite sides of and immediately adjacent the gate section. A conductive layer (61, 120) is deposited to fill the recesses, and then is planarized back to the upper ends of the gate sections. The portion of the conductive material remaining in each recess is self-aligned to be immediately adjacent at least one gate section, and serves as a local interconnect for a respective source or drain region.

7 Claims, 8 Drawing Sheets

US 6,737,347 B1

SEMICONDUCTOR DEVICE WITH FULLY SELF-ALIGNED LOCAL INTERCONNECTS, AND METHOD FOR FABRICATING THE DEVICE

This application claims priority under 35 USC §119(e)(1) of provisional application No. 60/160,495 filed Oct. 20, 1999.

CROSS-REFERENCE TO RELATED APPLICATION

This application is related to a co-pending application entitled "SEMICONDUCTOR DEVICE WITH FULLY SELF-ALIGNED LOCAL INTERCONNECTS, AND METHOD FOR FABRICATING THE DEVICE".

TECHNICAL FIELD OF THE INVENTION

This invention relates in general to a method of fabricating a semiconductor device and, more particularly, to a method of fabricating local interconnects which are self-aligned with respect to a gate section.

BACKGROUND OF THE INVENTION

In one known type of integrated circuit, fabrication of a metal oxide semiconductor field effect transistor (MOSFET) is carried out in the following manner. A p-type silicon substrate has spaced n+ type source and drain regions formed adjacent an upper surface of the substrate. The source and drain regions have respective upwardly facing surface portions thereon, which are each a respective portion of the overall upper surface of the substrate. A gate section is formed to project upwardly from a location between the surface portions on the source and drain regions. The gate section includes a gate dielectric layer disposed on the substrate, a gate electrode disposed on the gate dielectric layer, and an insulating layer disposed on the gate electrode. Insulating sidewalls are provided on opposite sides of the gate dielectric layer, gate electrode and insulating layer. A dielectric layer is formed over the substrate and gate section, with an upper surface which is at a level higher than the upper end of the gate section.

Then, in order to create local interconnects to the source and drain regions, a patterned etch is carried out using a selective etching technique, with an etch mask that includes two spaced etch regions which each correspond to a respective one of the source region and drain regions. During etching, each etch region results in the creation of a respective recess extending downwardly through the dielectric layer to the surface portion on top of one of the source region or drain region. Subsequently, a layer of a conductive material is deposited on the device in order to fill the recesses, and then is planarized to the top of the dielectric layer, so that the portions of the conductive material which remain in the recesses serve as local interconnects for the source and drain regions.

A consideration involved in using this known fabrication technique is that it is very difficult to precisely align the etch mask with the device, in particular so that the two etch mask regions are each properly positioned over a respective one of the source and drain regions. This difficulty is due in part to the fact that levels of integration have been progressively increasing over recent years, but alignment techniques do not scale the same as the actual circuit geometry, because alignment techniques involve mechanical considerations, whereas scaling of the circuit geometry involves optical considerations. These considerations affect the spacing between the two etch regions. It would ideally be desirable that the two etch regions be spaced by a distance equal to the width of the gate section so that, in a situation where the two etch regions both happen to be properly positioned, the adjacent sides of the etch regions would each be disposed directly above a respective side edge of the gate section, and the resulting recesses would each be immediately adjacent the gate section with no intervening dielectric material. In actual practice, however, due to potential problems associated with possible mispositioning, the two etch regions have between them a spacing which is somewhat greater than the width of the gate section. Thus, in a situation where these two etch regions both happen to be properly positioned, the adjacent sides of the etch regions will each be disposed a small distance outwardly from a respective side edge of the gate section, and the two resulting recesses will each be spaced a small distance from the gate section, with some dielectric material between each recess and the gate section.

Usually, of course, the two etch regions are not perfectly positioned with respect to the gate section, because there is a physical offset between the actual position and the desired position of the mask relative to the device. Consequently, when the offset is present, one of the two etch regions will typically have an edge portion that overlaps slightly with the gate section, and the other etch region will be spaced slightly from the gate section. As a result, one of the resulting recesses will be immediately adjacent the gate section, but the other will be spaced slightly from the gate section, with intervening dielectric material.

In order to compensate for such an offset in the etch mask, and the added spacing between the etch regions, while ensuring that the necessary contact area exists between each local interconnect and the associated source or drain region, the known process fabricates each of the source and drain regions with a size which is larger than would otherwise be necessary. In an integrated circuit with a number of such MOSFET devices, the overall integrated circuit must be somewhat larger than if the source and drain regions were of ideal size, and for example may be much as 15% to 25% larger. This in turn results in the integrated circuit having a lower circuit density than would be desirable. Moreover, since each of the source and drain regions are larger than necessary, the result is larger junction areas, larger junction capacitances, larger junction leakage currents, and larger source and drain resistances. Consequently, while this known technique for forming local interconnects has been generally adequate for its intended purposes, it has not been satisfactory in all respects.

SUMMARY OF THE INVENTION

From the foregoing, it may be appreciated that a need has arisen for an integrated circuit having two local interconnects that are self-aligned with respect to a section of the device which is disposed between them so as to permit a reduction in the size of the integrated circuit, and a method of making such a device.

According to one form of the present invention, a method is provided to address this need, and involves: fabricating a structure that includes laterally spaced first and second sections with respective upwardly facing first and second surface portions thereon, and that includes a third section projecting upwardly beyond each of the first and second surface portions from a location therebetween, the third section having in the region of an upper end thereof an upwardly facing third surface portion, and the first, second and third surface portions each being provided on material which is one of conductive and semiconductive; forming on the structure an insulating layer which has portions disposed over the first and second surface portions, the third section extending into the insulating layer; etching the device, including the step of effecting a patterned etch of an upper side of the insulating layer using an etch pattern, the etch pattern including an etch region which extends from a location disposed over the first surface portion to a location disposed over the second surface portion, the patterned etch creating first and second recess portions which respectively extend downwardly through the insulating layer toward the first and second surface portions on opposite sides of the third section, wherein at the completion of the etching step the first, second and third surface portions are exposed; depositing a conductive material into the first and second recess portions; and planarizing an upper side of the device to a level corresponding to an upper end portion of the third section, so that the first and second recess portions have therein respective portions of the conductive material which respectively have upwardly facing fourth and fifth surface portions on the upper ends thereof.

According to another form of the present invention, an apparatus is provided to address the need discussed above, and includes: a semiconductor substrate having spaced first and second sections which are respectively a source region and a drain region which have respective upwardly facing first and second surface portions thereon; a third section projecting upwardly beyond each of the first and second surface portions from a location therebetween, the third section being a gate section which includes a gate dielectric layer, a gate electrode over the gate dielectric layer, and insulator sidewalls disposed on opposite sides of the gate dielectric layer and the gate electrode, the gate electrode having on an upper side thereof a third surface portion; an insulating layer which has portions disposed over the first and second surface portions, the third section extending into the insulating layer, and the insulating layer having first and second recess portions which respectively extend downwardly through the insulating layer toward the first and second surface portions on opposite sides of the third section, each recess portion being immediately adjacent a respective side of the third section; a first portion of conductive material disposed in the first recess portion and having on an upper side thereof a fourth surface portion; and a second portion of conductive material disposed in the second recess portion and having on an upper side thereof a fifth surface portion, the third, fourth and fifth surface portions being substantially coplanar with each other and with an upper surface of the insulating layer.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
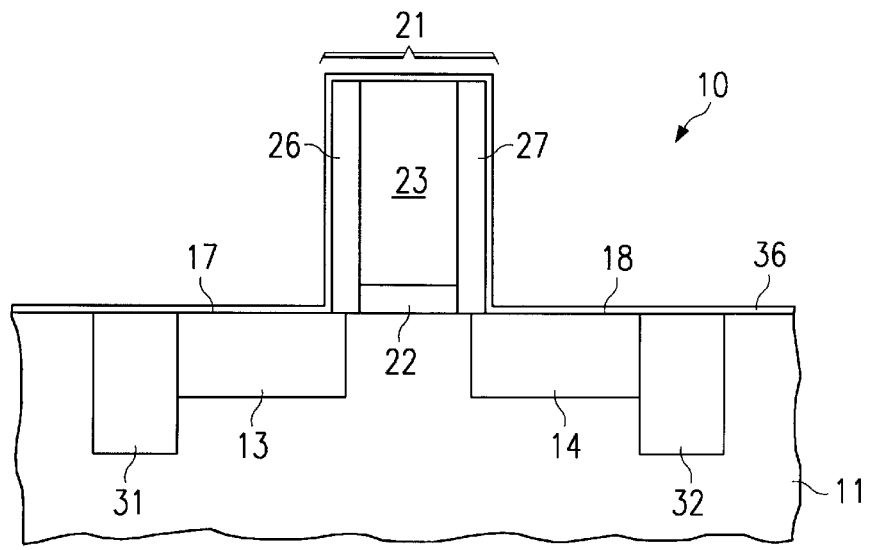
FIG. 1 is a diagrammatic sectional side view of part of an integrated circuit, showing the configuration thereof at an intermediate stage during its fabrication according to a method which embodies the present invention.

FIG. 1 is a diagrammatic sectional side view of a portion of a semiconductor device 10 which embodies the present invention. FIG. 1 shows the device 10 as it appears at an intermediate stage during its fabrication.

At the stage of fabrication shown in FIG. 1, the device 10 includes a semiconductor substrate 11. In the disclosed embodiment, the substrate 11 is a p-type silicon material, the substrate 11 having spaced source and drain regions 13 and 14 adjacent its upper surface. The source and drain regions 13–14 may each be an n+ region. The source and drain regions 13–14 have respective upwardly facing surface portions 17 and 18 on the upper side thereof, the surface portions 17–18 each being a portion of the overall upper surface of the substrate 11.

The device 10 further includes a gate section 21, which is provided on and projects upwardly from the upper surface of the substrate 11, in particular from a location between the surface portions 17–18. The gate section 21 includes a gate dielectric layer 22, which is provided on the silicon substrate 11 between the source and drain regions 13–14. In the disclosed embodiment, the gate dielectric layer 22 is silicon dioxide. A gate electrode 23 is provided on the gate dielectric layer 22. In the disclosed embodiment, the gate electrode 22 is an n+ doped polysilicon material. The gate section 21 further includes two spaced, insulating sidewalls 26 and 27, which have between them the dielectric layer 22 and the gate electrode 23. In the disclosed embodiment, the sidewalls 26–27 are made of a nitride, such as $Si_3N_4$.

Spaced isolation regions 31 and 32 are provided in the silicon substrate 11. In the disclosed embodiment, the isolation regions 31–32 are formed in a known manner, using a technique commonly known as shallow trench isolation (STI). The source and drain regions 13–14 are between the isolation regions 31–32, each of the source and drain regions 17–18 being adjacent a respective one of the isolation regions 31–32.

Following formation of the gate section 21, a layer 36 of a material such as titanium or cobalt is applied over the top of the semiconductor device, in particular so that the layer 36 is in contact with the upwardly facing surface portions 17–18 on the source and drain regions 13–14, and also with the upwardly facing surface portion on the gate electrode 23. The device is then heated, in order to create a thin layer of silicide at each of these upwardly facing surfaces, as shown diagrammatically at 41, 42 and 43 in FIG. 2. The remaining material of the layer 36 is then removed in a known manner, for example by using an appropriate etching technique.

Figure 2:
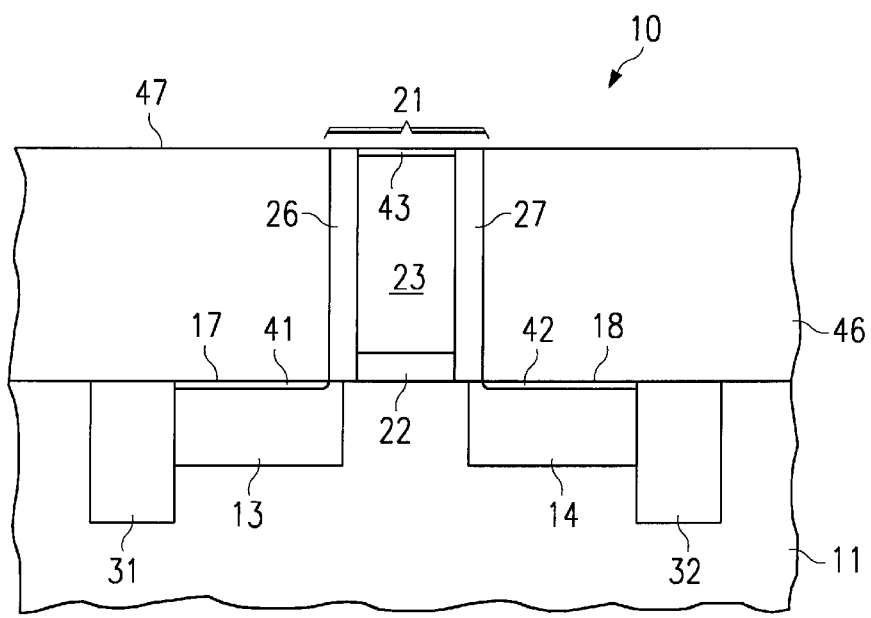
FIG. 2 is a diagrammatic sectional side view similar to FIG. 1, but showing the integrated circuit at a later stage in the fabrication process.

Thereafter, an insulating pre-metal dielectric (PMD) layer 46 is applied over the top of the substrate 11 and gate section 21. In the disclosed embodiment, the PMD layer 46 is silicon dioxide. The top surface of the layer 46 is initially higher than and covers the gate section 21, but then is planarized back to a level 47 which corresponds to the upper end of the gate section 21. This is the stage of the fabrication process which is depicted in FIG. 2. The layer 46 engages the surface portions 17–18 on the source and drain regions 13–14, and also engages the sidewalls 26–27.

Those skilled in the art will recognize that the gate section 21, together with the source and drain regions 13–14, define a metal oxide semiconductor field effect transistor (MOSFET). Although the present invention is described in the specific context of a MOSFET, this is only by way of example. The method according to the present invention is not limited to use with MOSFETs, but could be used to fabricate other circuit components.

Once the device 10 has reached the stage of fabrication shown in FIG. 2, the next step according to the invention is to carry out a patterned etch of the dielectric layer 46, in order to form recesses or trenches that will contain local interconnects or contacts for the source and drain regions 13–14. This patterned etch is explained in more detail with reference to FIG. 3, which is a diagrammatic top view of the device 10 of FIG. 2.

Figure 3:
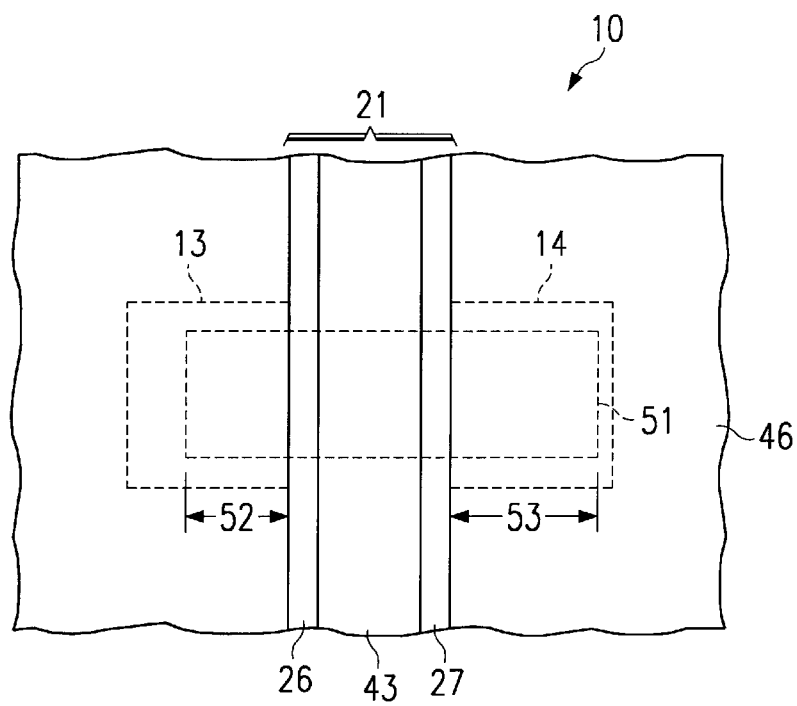
FIG. 3 is a diagrammatic top view of the integrated circuit of FIG. 2, and also shows an etch mask which is used during fabrication of the integrated circuit.

FIG. 3 shows in broken lines a rectangular etch region 51, where etching will be carried out inside the boundary of the region 51, and where etching will be prevented by an etch mask in areas immediately outside the region 51. It will be noted that the etch region 51 has its opposite end portions respectively disposed over the source and drain regions 13–14, and has a center portion which is disposed over the gate section 21. It will also be noted that the etch region 51 has a slight misalignment or offset with respect to device 10, for example as evident from the fact that arrow 52 is shorter than arrow 53. The misalignment shown in FIG. 3 represents a physical offset between the device 10 and the mask used for the patterned etch. Stated differently, the actual position of the mask is offset from a desired position relative to the device 10, due to practical limitations in the ability to accurately align the mask with respect to the device. The misalignment shown in FIG. 3 is one example of possible misalignment, which is illustrative for purposes of the present invention.

The patterned etch is then carried out using this etch mask, so that etching occurs within the region 51. In more detail, the etching is a selective etching according to a known technique, which removes the silicon dioxide material of the dielectric layer 46, but does not remove the nitride material of the sidewalls 26–27, and also does not remove the silicide material 41–43.

Figure 4:
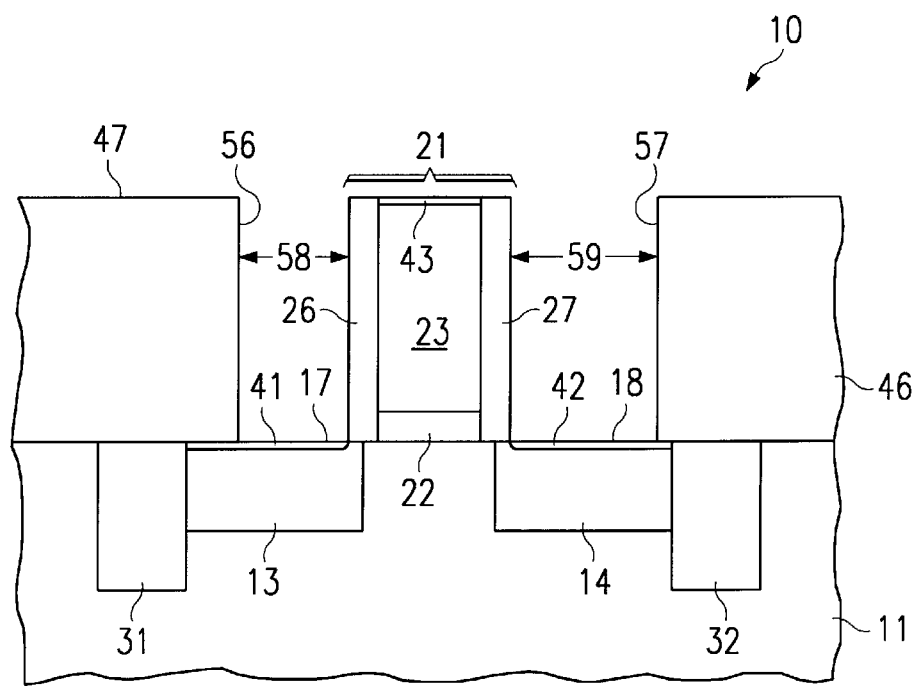
FIG. 4 is a diagrammatic sectional side view similar to FIG. 2, but showing the integrated circuit at a still later stage during its fabrication.

FIG. 4 is a diagrammatic sectional side view similar to FIG. 2, but showing the device 10 after completion of the patterned etch. The result of the patterned etch is two recesses 56 and 57, which extend downwardly on opposite sides of the gate section 21. It should be noted that, even though the etch mask was misaligned with respect to the device 10, each of the recesses 56 and 57 is immediately adjacent the gate section 21, with no residual dielectric material between the gate section 21 and either of the recesses 56 and 57. In accord with the present invention, this will be true even if the width of the gate section 21 represents the shortest gate length present in the entire integrated circuit. The recesses 56–57 extend to and open through the bottom surface of the dielectric layer 46, so as to expose areas of the surface portions 17–18 on the upper sides of the silicide layers 41–42. As evident from the length of arrows 58 and 59 in FIG. 4, which respectively correspond in length to arrows 52 and 53 in FIG. 3, it will be noted that the recess 56 is wider than the recess 57. After completion of the patterned etch, the mask defining the etch region 51 is removed from the surface 47 using known techniques.

Figure 5:
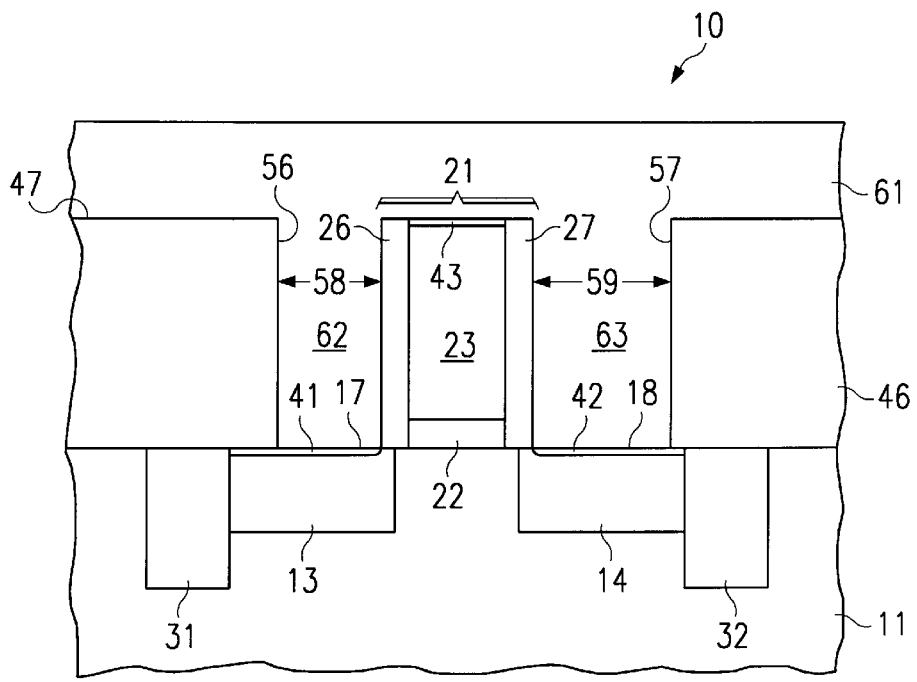
FIG. 5 is a diagrammatic sectional side view similar to FIG. 4, but showing the integrated circuit at yet a later stage during its fabrication.

With reference to FIG. 5, the next step in the process is to deposit a layer 61 of a conductive material such as tungsten on the upper side of the device 10. The conductive layer 61 has portions 62 and 63 which respectively extend into the recesses 56–57, and which respectively engage the surface portions 17–18 on the silicide layers 41–42 of the source and drain regions 13–14. The conductive material 61 is then planarized back to a level that corresponds to the surface 47 and the upper end of the gate section 21, resulting in the structure shown in FIG. 6. This planarization step may be carried out using either a known chemical mechanical polishing (CMP) technique, or using a known etching technique. Use of an etch is simpler than use of a CMP, because the dielectric layer 46 is planarized to the level 47 before the conductive layer 61 is deposited. However, the invention encompasses the use of either technique.

Figure 6:
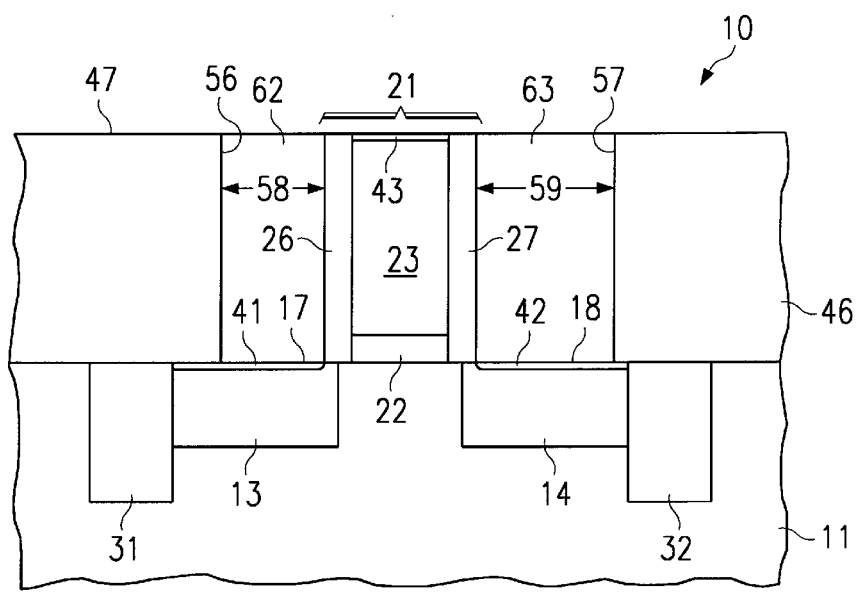
FIG. 6 is a diagrammatic sectional side view similar to FIG. 5, but showing the integrated circuit at a still later stage during its fabrication.

Referring to FIG. 6, it will be noted that the portions 62–63 of the conductive material are electrically isolated from each other, and each engage a respective one of the surface portions 17–18 on the silicide layers 41–42 for the source and drain regions 13–14. Further, the conductive portions 62–63 each extend upwardly to a level which corresponds to the upper end of gate section 21 and the surface 47 on layer 46. It should also be noted that the conductive portions 62–63 are each immediately adjacent a respective nitride sidewall 26 or 27, with no intervening residual material from the dielectric layer 46.

Figure 7:
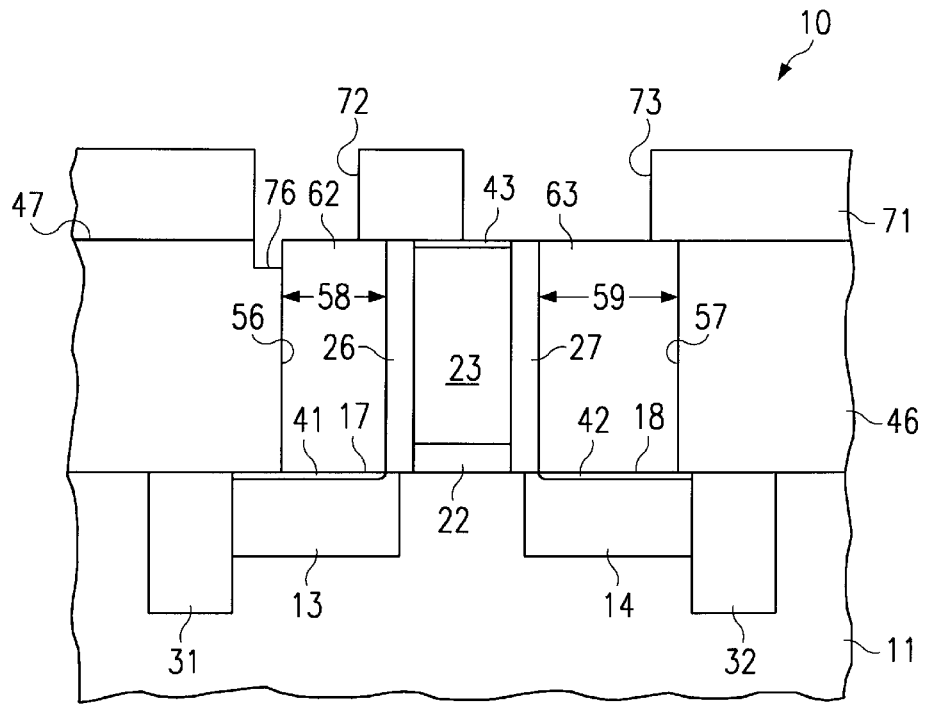
FIG. 7 is a diagrammatic sectional side view similar to FIG. 6, but showing the integrated circuit at yet a later stage during its fabrication.

According to the invention, and with reference to FIG. 7, the next step is to deposit a second PMD layer 71 on the top surface 47 of the first PMD layer 46, and to then carry out a patterned etch using known techniques, in order to create recesses such as those shown at 72 and 73, which extend completely through the PMD layer 71. The recess 73 exposes portions of the silicide layer 43 and the upper end of the conductive portion 63. The recess 72 exposes an upper end portion of the conductive portion 62. As shown at 76 in FIG. 7, misalignment between the etch patterns for the two dielectric layers may lead to the result that the etch of PMD layer 71 also removes some material of the PMD layer 46. However, this is not a problem. In particular, as shown in the specific example of FIG. 7, the recess portion 76 exposes part of an upper end portion of a side surface of the conductive portion 62, thus increasing the overall area of contact between the conductive portion 62 and some further conductive material 81 discussed below.

Figure 8:
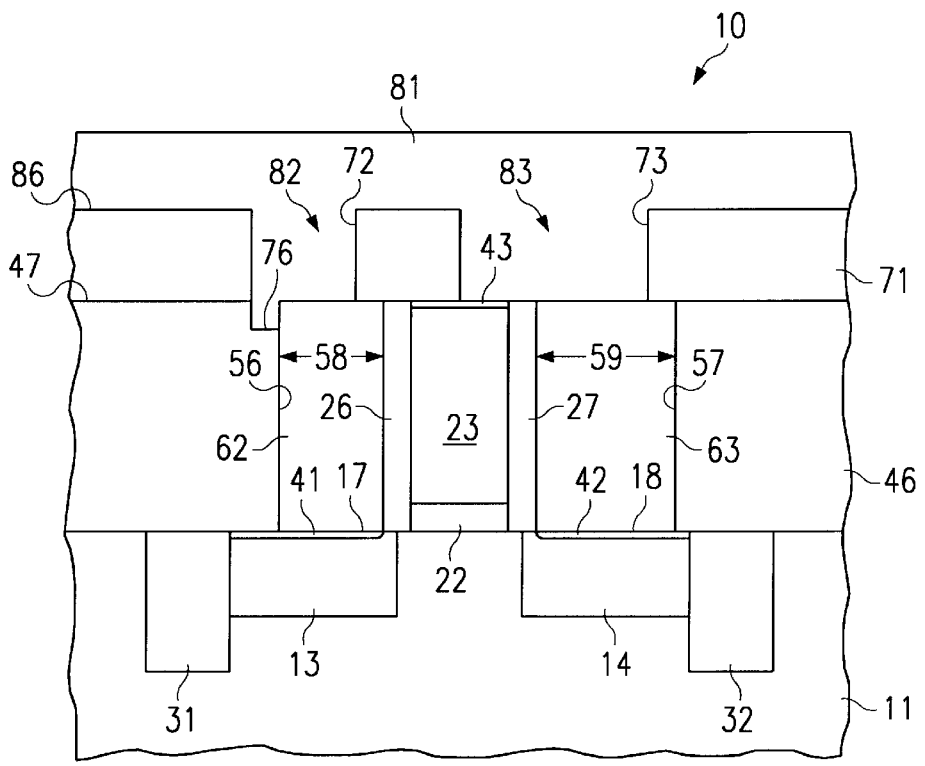
FIG. 8 is a diagrammatic sectional side view similar to FIG. 7, but showing the integrated circuit at an even later stage during its fabrication.

More specifically, and with reference to FIG. 8, the next step in the process is to deposit a layer 81 of conductive material such as tungsten on the upper side of the device 10. The conductive layer 81 has portions 82 and 83, which respectively extend into and fill the recesses 72–73, including the portion 76 of recess 72. The conductive material 81 is then planarized back to a level that corresponds to a surface 86 on the upper side of the PMD layer 71, resulting in the structure shown in FIG. 9. This planarization step may be carried out using either a known chemical mechanical polishing (CMP) technique, or using a known etching technique. Use of an etch is simpler here than use of CMP, but the present invention encompasses the use either technique.

Figure 9:
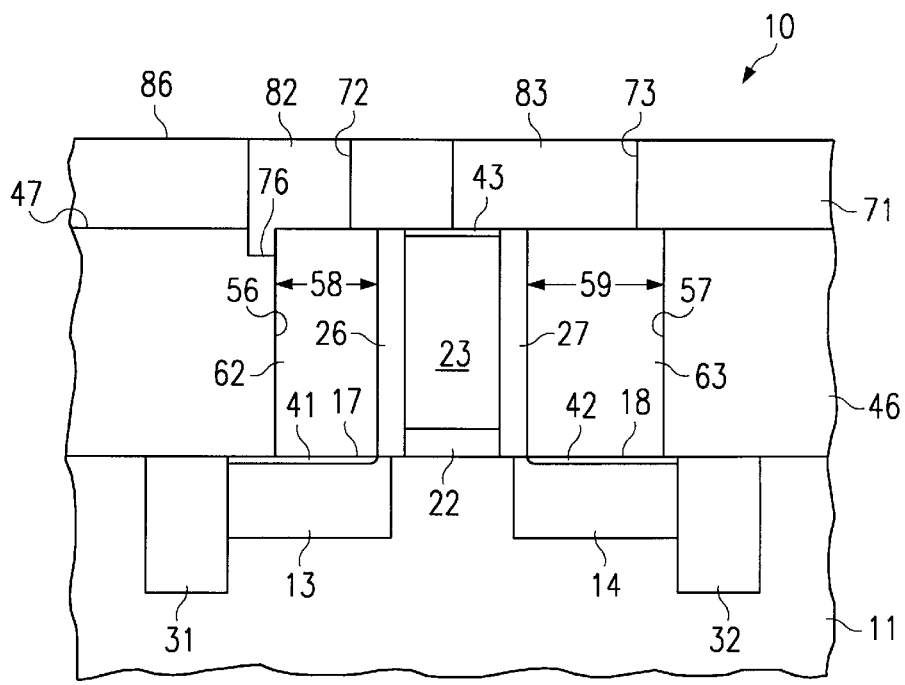
FIG. 9 is a diagrammatic sectional side view similar to FIG. 8, but showing the integrated circuit at yet a later stage during its fabrication.

In FIG. 9, the portions 62 and 82 of conductive material serve as a local interconnect or contact, which provides an electrical connection between the source region 13 and a not-illustrated metalization layer which will eventually be added on top of the device 10 during subsequent processing. Similarly, the portions 63 and 83 of conductive material serve as a local interconnect which couples the drain region 14 and the gate electrode 23 to each other, and which will also couple the drain region 14 and gate electrode 23 to the not-illustrated metalization layer that will eventually be added on top of the device 10.

FIGS. 10–13 show a device 110 which is a structural variation of the device 10 shown in FIGS. 1–9, and which is fabricated using an alternative embodiment of the process discussed above in association with FIGS. 1–9. More specifically, with reference to FIG. 10, the device 110 includes a substrate 11 having spaced source and drain regions 13 and 14 that are disposed between spaced isolation regions 31 and 32. Three layers 112, 113 and 114 have been successively deposited on the substrate 11. In the disclosed embodiment, the layers 112 and 114 are each a dielectric material such as silicon dioxide, and the layer 113 is an n+ doped polysilicon material.

Figure 10:
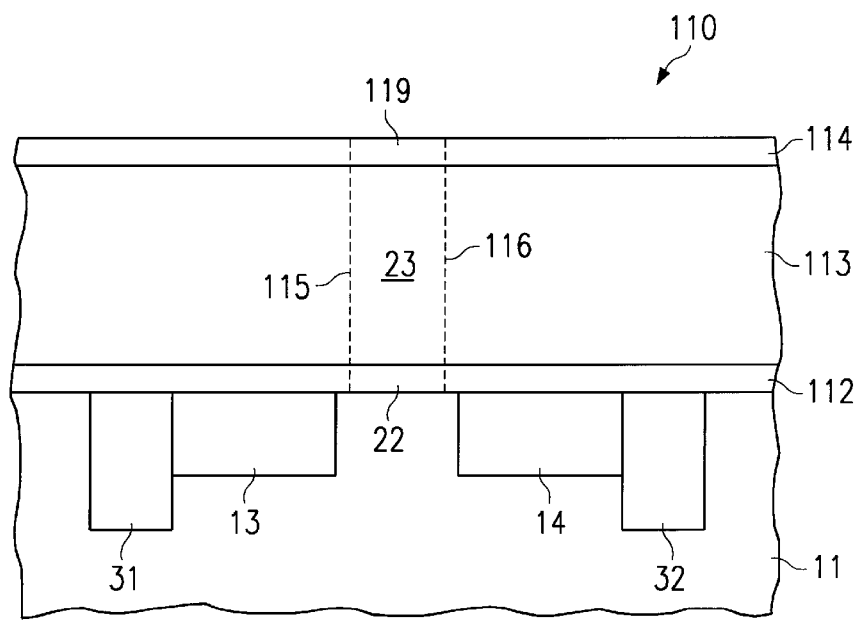
FIG. 10 is a diagrammatic sectional side view of an integrated circuit which is an alternative embodiment of the integrated circuit of FIGS. 1–9 and which is fabricated according to a method that is an alternative embodiment of the method of FIGS. 1–9, the integrated circuit of FIG. 10 being shown at an intermediate stage during its fabrication.

After fabrication of the device 110 reaches the stage which is shown in FIG. 10, the device 110 is subjected to a patterned etch which removes material from layers 112–114, other than the portions of these layers which are disposed between the broken lines 115 and 116 in FIG. 10. In particular, the portions between broken lines 112–114 are respectively identified with reference numerals 22, 23 and 119. Portion 22 of layer 112 will eventually serve as a gate dielectric layer, portion 23 of layer 113 will eventually serve as a gate electrode, and portion 119 of layer 114 will serve as a temporary layer on top of the gate electrode 23.

Figure 11:
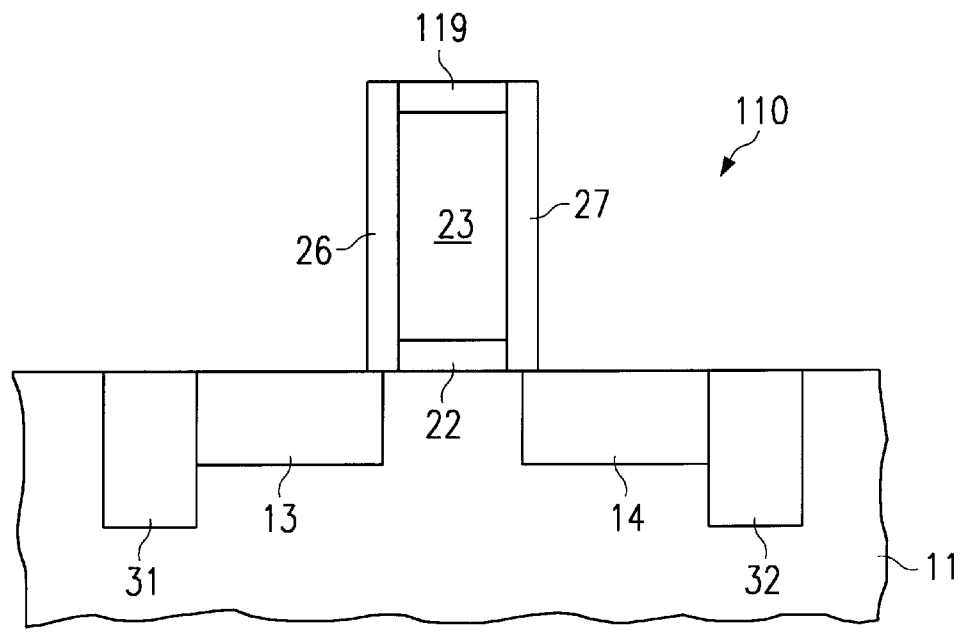
FIG. 11 is a diagrammatic sectional side view similar to FIG. 10, but showing the integrated circuit at a later stage during its fabrication.
Figure 12:
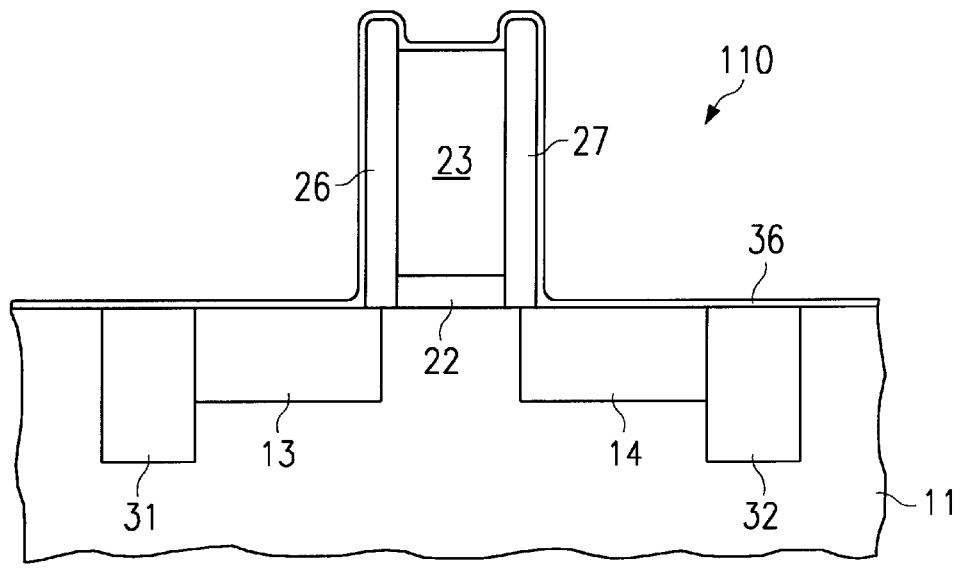
FIG. 12 is a diagrammatic sectional side view similar to FIG. 11, but showing the integrated circuit at a still later stage during its fabrication.

Next, with reference to FIG. 11, insulating sidewalls 26 and 27 are fabricated on opposite sides of the dielectric layer 22, gate electrode 23 and temporary layer 119. The temporary layer 119 is then removed using an appropriate selective etch technique of a type known in the art. Then, a layer 36 of titanium or cobalt is applied over the device, resulting in the structure shown in FIG. 12. It will be noted that the structure of FIG. 12 is effectively the same as the structure shown in FIG. 1, the only difference being that the sidewalls 26 and 27 each project slightly above the top of the gate electrode 23 in FIG. 12, whereas in the device 10 in FIG. 1 the sidewalls do not project above the top of the gate electrode 23. From this point on, the fabrication of the device 110 is carried out in a manner similar to that described above in association with FIGS. 1–9 for the device 10. Accordingly, only differences between the two processes will be discussed here.

Figure 13:
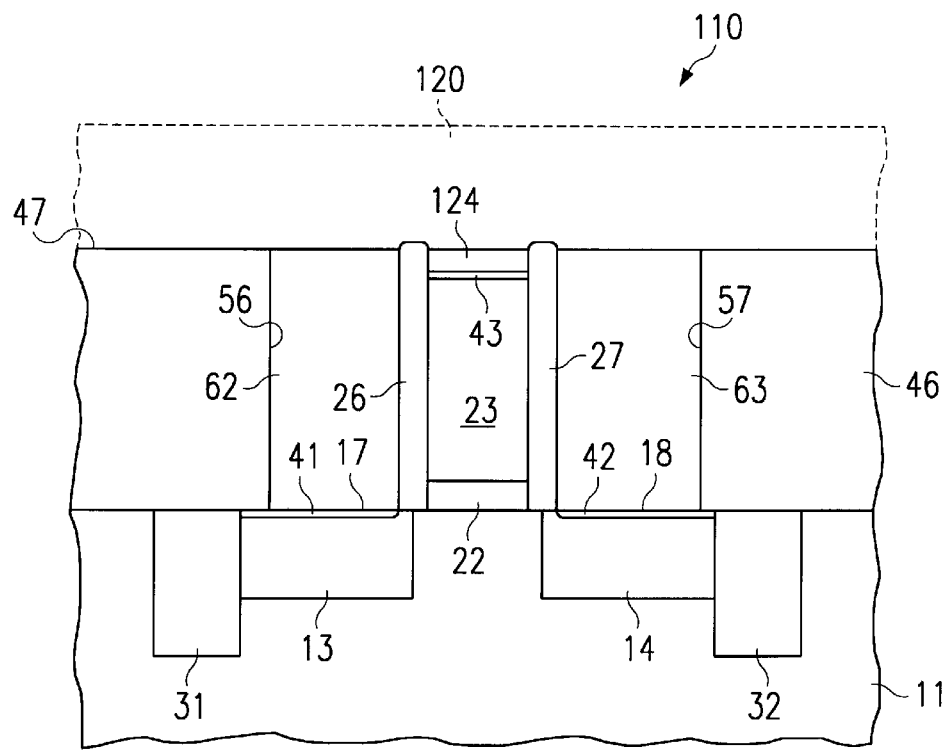
FIG. 13 is a diagrammatic sectional side view similar to FIG. 12, but showing the integrated circuit at yet a later stage during its fabrication.

In this regard, FIG. 13 shows the device 110 at a stage of its fabrication process which corresponds generally to the stage of device 10 shown in FIG. 6. At this stage, silicide layers 41–43 have been formed in a manner similar to that described above in association with FIGS. 1–9, and a PMD layer 46 has been applied and then planarized back to a level corresponding to the upper ends of the sidewalls 26 and 27. It is during this planarization that the height of the sidewalls 26 and 27 becomes significant. In particular, when the planarization is carried out by a CMP technique, the fact that the sidewalls 26 and 27 project a small distance above the gate electrode 23 and this thin temporary layer 119 has the effect of protecting the silicide layer 43 from the CMP process, so that little or no material of the silicide layer 43 is removed during this CMP process.

Following the planarization, a patterned etch of the type discussed above in association with FIGS. 1–9 is carried out, in order to create the recesses 56 and 57 in dielectric layer 46. Then, a layer of conductive material such as tungsten is deposited on top of the device, for example as indicated diagrammatically at 120 in FIG. 13. The layer 120 of conductive material is then planarized back to the upper ends of the sidewalls 26 and 27, thereby leaving the portions 62 and 63 of conductive material in the recesses 56 and 57. Further an additional portion 124 of conductive material may possibly remain on top of the silicide layer 43 between the sidewalls 26 and 27. However, this is not a problem, so long as planarization is carried out to the tops of the sidewalls 26 and 27, because there will be no remaining portion of the conductive material 120 which bridges the tops of sidewalls 26–27, and thus no electrical continuity between the conductive portion 124 and the conductive portions 62 and 63. From the stage of fabrication shown in FIG. 13, further processing of the device 110 is carried out in a manner similar to that described above for the device 10 in association with FIGS. 7–9.

Figure 14:
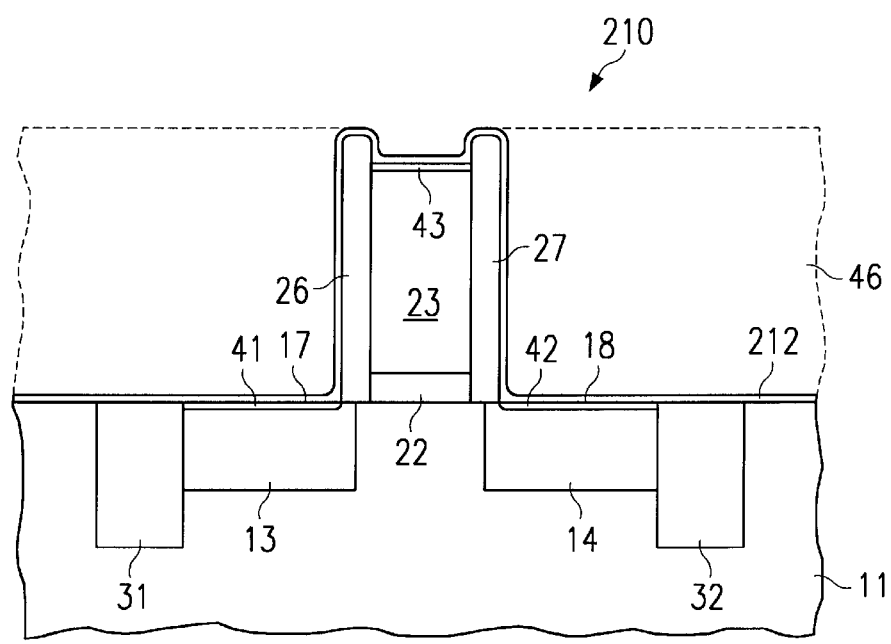
FIG. 14 is a diagrammatic sectional side view of an integrated circuit which is a further alternative embodiment of the integrated circuit of FIGS. 1–9 and which is fabricated according to a method that is an alternative embodiment of the method of FIGS. 1–9, the integrated circuit of FIG. 14 being shown at an intermediate stage during its fabrication.

FIG. 14 is a diagrammatic sectional side view of a device 210 which is fabricated according to a variation of the process described above in association with FIGS. 10–13. The initial fabrication of the device 210 is carried out in a manner similar to that described above for the device 110. At the stage of fabrication shown in FIG. 14, the device 210 includes a p-type silicon substrate 11, the substrate 11 having therein spaced isolation regions 31 and 32. Spaced source and drain regions 13 and 14 are provided between the isolation regions 31 and 32. Projecting upwardly from the substrate between the source and drain regions 13 and 14 is a gate structure, which includes a gate dielectric layer 22, a gate electrode 23 provided on the dielectric layer 22, and spaced sidewalls 26 and 27 which are provided on opposites of the layer 22 and electrode 23, and which each project a small distance above the top of the gate electrode 23. Thin silicide layers 41–43 have been fabricated at the upper surfaces of the source and drain regions 13 and 14 and the gate electrode 23, in a manner similar to that already described above. At this point in the process, a conformal layer 212 of an insulating material is applied over the top of the device. The conformal layer 212 may be a nitride such as $Si_3N_4$. The conformal layer 212 provides two benefits. First, when the PMD layer 46 is subsequently applied and subsequently etched to effect planarization and/or to create recesses for local interconnects, the conformal layer 212 serves as an etch stop. Second, the portions of the conformal layer 212 which are disposed on the sidewalls 26 and 27 serve to thicken and strengthen the sidewalls 26 and 27, thereby facilitating their function in protecting the silicide layer 43 during planarization by a CMP process. After recesses for local interconnects have been etched in the PMD layer 46, a brief etch of the portions of the conformal layer 212 over each of the silicide layers 41–43 is carried out, in order to create three openings through the conformal layer 212 which are each disposed over a respective one of the silicide layers 41–43. These openings permit the conductive material of the local interconnects to make electrical contact with the silicide layers 41–43. Subsequent processing of the device 210 is carried out in the same manner as that described above for the device 110.

Figure 15:
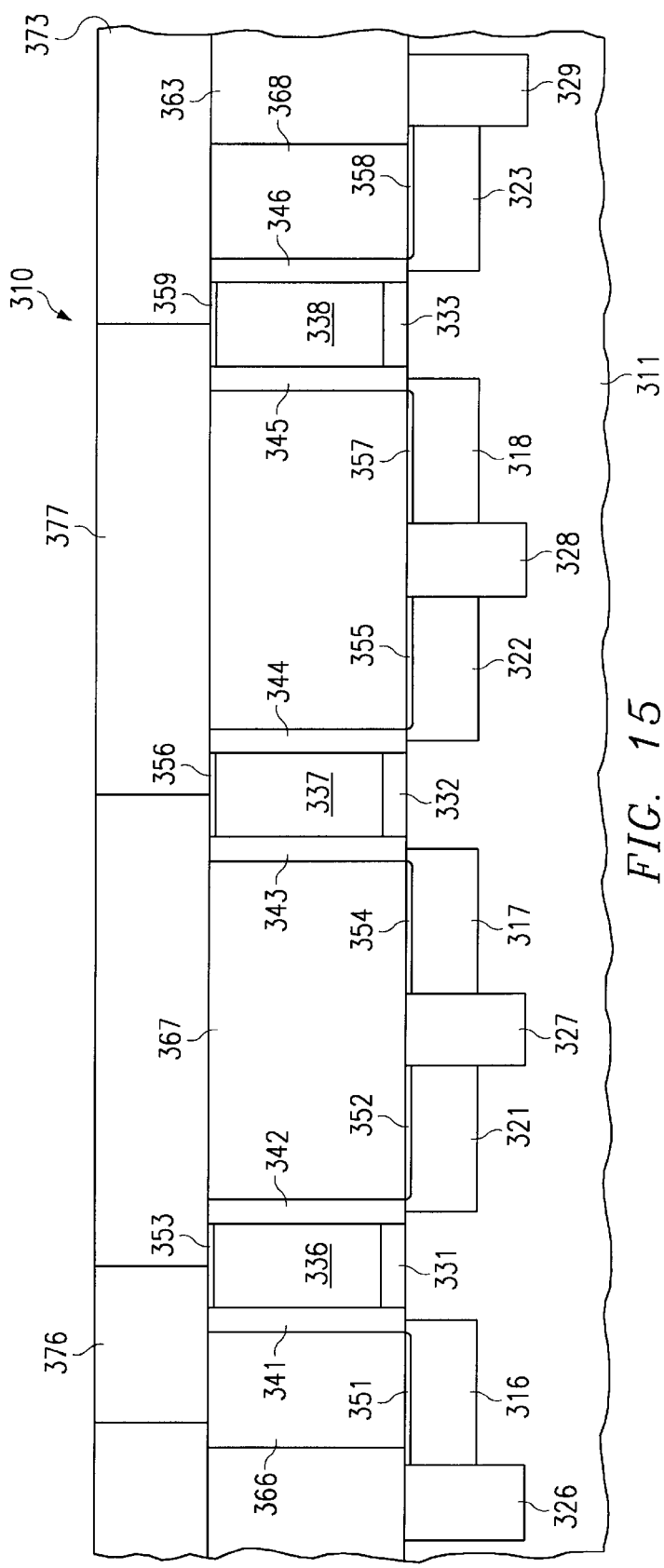
FIG. 15 is a diagrammatic sectional side view of yet another integrated circuit which is an alternative embodiment of an integrated circuit of FIGS. 1–9, and which is fabricated according to the same method used for the integrated circuit of FIGS. 1–9.

FIG. 15 is a diagrammatic sectional side view of a semiconductor device 310 which is another alternative embodiment of the device 10 discussed above in association with FIGS. 1–9. The device 310 is fabricated according to the same process as the device 10, but has a different structural configuration, which illustrates some additional advantages of the present invention. Since the process is essentially the same, and the resulting structure of the device is similar, only a brief summary of the structure should be needed here.

More specifically, the device 310 includes a silicon substrate 311 having a plurality of source regions 316–318 which are spaced from associated drain regions 321–323, with isolation regions 326–329 provided at appropriate locations. Three gate structures each include a respective gate dielectric layer 331–333, a gate electrode 336–338, and sidewalls 341–346. A respective silicide layer 351–359 has been formed on each of the source regions 316–318, drain regions 321–323, and gate electrodes 336–338. A first PMD layer 363 includes recesses which contain portions 366–368 of a conductive material, and a second PMD layer 373 has recesses which contain respective portions 376–377 of a conductive material.

Features to note in FIG. 15 are that the portion 367 of conductive material in the first PMD layer 363 effects a direct connection between two active regions in the substrate 311, namely the drain region 321 and the source region 317. In addition, the portion 376 of conductive material in the second layer 373 effects a direct connection between the gate electrode 336 and, through interconnect 366, an active region 316 which is a source region. Moreover, the portion 377 of conductive material in the second PMD layer 373 effects a direct connection between two gate electrodes 337 and 338. The capability to make certain connections in the PMD layers 363 and 373 can help reduce the complexity of the overall device, by reducing the number of connections which must be made up to and through the first metalization layer, and by thus reducing the complexity of the first metalization layer itself.

The present invention provides a number of technical advantages. One such technical advantage is that two local interconnects such as contacts can be fabricated on opposite sides of a gate section, in a manner so that they are both immediately adjacent the gate section. In other words, there is no space between the gate section and either contact. Each such local interconnect is immediately adjacent the associated gate section, and the requisite contact area between each local interconnect and the associated source or drain region can be ensured with a smaller source or drain region than was required for preexisting techniques. By reducing the size of the source and drain regions, the overall size of the integrated circuit can be reduced, thereby resulting in a higher circuit density within the integrated circuit. Further, reducing the sizes of the source and drain regions reduces the sizes of the associated junction areas in the semiconductor substrate, as well as junction capacitances, junction resistances and junction leakage currents.

A further advantage is that a single etch region can be used to form two or more local interconnects, all of which are self-aligned with respect to one or more gate sections. A further advantage is that some embodiments of the method according to the invention can be implemented without any more process steps than are required for a preexisting process, and in some cases with fewer process steps. Yet another advantage is that the method according to the invention permits a significant number of interconnections to be made by the local interconnects which are below the first level of metalization. Still another advantage is the provision of a technique which helps to protect certain portions of the structure from damage during a CMP technique. A further advantage is that these fully self-aligned local interconnects can be made in a MOSFET context without the need to provide an insulating layer over the gate section while forming the recesses for the local interconnects.

Although several exemplary embodiments have been illustrated and described in detail, it should be understood that there are substitutions and alterations which can be made without departing from the scope of the present invention. For example, the foregoing discussion sets forth exemplary materials which can be used for the various parts of the disclosed devices, but it will be recognized that there are other suitable materials which could be substituted for some or all the disclosed materials, without departing from the present invention. As another example, the disclosed embodiment involves the formation of a silicide at each of several surfaces, but it would be possible to carry out the present invention without formation of these silicides.

Further, the present invention has been disclosed in the specific context of a particular type of MOSFET component, but it will be recognized that the techniques of the present invention can be used in association with other types of components. Moreover, the etch regions disclosed in the present application have been depicted as being generally rectangular, but it will be recognized that there are other shapes which could be used and which are encompassed by the present invention. Other substitutions and alterations are also possible without departing from the spirit and scope of the present invention, as defined by the following claims.

What is claimed is:

1. A method of making a semiconductor device, comprising the steps of:
   a. fabricating a structure that includes laterally spaced first and second sections with respective upwardly facing first and second surface portions there on, and that includes a third section projecting upwardly beyond each of said first and second surface portions from a location therebetween, said third section having in the region of an upper end thereof and upwardly facing third surface portion, and said first, second and third portions each being provided on material which is one of conductive and semiconductive;

b. fabricating said third section with first and second wall portions which are disposed on opposite sides of and project upwardly beyond said third surface portion, the first and second wall portions include a first insulating material;

c. forming on said structure an insulating layer which has portions disposed over said first and second surface portions, said third section extending into said insulating layer;

d. planarizing an upper side of said device to a level corresponding to the upper end portion of said first and second wall portions, so that the third surface is protected from the planarizing;

e. etching said device, including the step of effecting a patterned etch of an upper side of said insulating layer using an etch pattern, said etch pattern including an etch region which extends from a location disposed over said first surface portion to a location disposed over said second surface portion, said patterned etch creating first and second recess portions which respectively extend downwardly through said insulating layer toward said first and second surface portions on opposite sides of said third section, wherein at the completion of said etching step said first, second and third surface portions are exposed;

f. depositing a conductive material into said first and second recess portions; and g. planarizing an upper side of said device at least to a level corresponding to an upper end portion of said third section, so that said first and second recess portions have therein respective portions of said conductive material which respectively have upwardly facing fourth and fifth surface portions on the upper ends thereof.

2. The method according to claim 1, including after said fabricating step in step b and before said forming step in step c, the step of forming a silicide at each of said first, second and third surface portions.

3. The method according to claim 2, wherein said step of forming said silicides includes the steps of: depositing a temporary layer which is one of titanium and cobalt, and which includes respective portions disposed on each of said first, second and third surface portions; thereafter heating said device to form said silicides; and thereafter removing portions of said temporary layer other than said silicides.

4. The method according to claim 1, wherein said fabricating step includes the step of forming spaced source and drain regions in a semiconductor substrate, said source and drain regions being said first and second sections, and forming on said substrate between said source and drain regions a gate section which includes a gate dielectric layer, a gate electrode over said gate dielectric layer, and the first and second wall portions disposed on opposite sides of said gate dielectric layer and said gate electrode, said the first and second wall portions being made of an insulating material, and said gate section being said third section.

5. The method according to claim 1, further comprising the steps of:

a. forming a second insulating layer over said first insulating layer;

b. carrying out a patterned etch of said second insulating layer to create an opening that extends through said second insulating layer and exposes at least one of said third, fourth and fifth surface portions;

c. depositing a second conductive material into said opening; and d. planarizing an upper side of said device so as to remove portions of said second conductive material which are above an upper side of said second insulating layer.

6. The method according to claim 5, wherein said patterned etch of said second insulating layer in step b is carried out so that said opening therein exposes at least two of said third, fourth and fifth surface portions, whereby said second conductive material electrically couples each of said surface portions exposed by said opening.

7. The method according to claim 5, wherein said step of fabricating a structure further includes fabricating laterally spaced fourth and fifth sections with respective upwardly facing sixth and seventh surface portions thereon, and includes a sixth section projecting upwardly beyond each of said sixth and seventh surface from a location therebetween, said sixth section having in the region of an upper end thereof an upwardly facing eighth surface portion, and said sixth, seventh and eighth surface portions each being provided on material which is one of conductive and semiconductive;

wherein said etch pattern for said patterned etch of said first insulating layer includes a further etch region that extends from a location disposed over said sixth surface portion to a location disposed over said seventh surface portion, said patterned etch of said first insulating layer creating third and fourth recess portions which respectively extend downwardly through said first insulating layer toward said sixth and seventh surface portions on opposite sides of said sixth section, said sixth, seventh and eighth surface portions each being exposed at the end of said etching step;

wherein said step of depositing conductive material into said first and second recess portions is carried out so as to also deposit conductive material into said third and fourth recess portions;

wherein said step of planarizing to said level is carried out so that said level corresponds to an upper end portion of each of said third and sixth sections, and so that said third and fourth recess portions respectively have therein third and fourth portions of the connective material which respectively have upwardly facing ninth and tenth surface portions on the upper ends thereof; and wherein said patterned etch of said second insulating layer is carried out so that said opening therein exposes one of said third, fourth and fifth surface portions and one of said eighth, ninth and tenth surface portions, whereby said second conductive material electrically couples each of said surface portions exposed by said opening.

* * * * *